(12) United States Patent
Bethoux et al.

(10) Patent No.: US 9,224,921 B2
(45) Date of Patent: Dec. 29, 2015

(54) METHOD FOR FORMING A BURIED METAL LAYER STRUCTURE

(75) Inventors: Jean-Marc Bethoux, Grenoble (FR); Pascal Guenard, Froges (FR)

(73) Assignee: SOITEC, Bernin (FR)

( * ) Notice: Subject to any disclaimer, the term of this patent is extended or adjusted under 35 U.S.C. 154(b) by 1 day.

(21) Appl. No.: 13/988,196

(22) PCT Filed: Nov. 16, 2011

(86) PCT No.: PCT/EP2011/070249
§ 371 (c)(1),
(2), (4) Date: Jul. 5, 2013

(87) PCT Pub. No.: WO2012/066033
PCT Pub. Date: May 24, 2012

(65) Prior Publication Data
US 2013/0285067 A1    Oct. 31, 2013

(30) Foreign Application Priority Data

Nov. 18, 2010  (FR) ...................................... 10 59476

(51) Int. Cl.
*H01L 21/00* (2006.01)
*H01L 33/32* (2010.01)
*H01L 21/762* (2006.01)
*H01L 33/00* (2010.01)
(Continued)

(52) U.S. Cl.
CPC .......... *H01L 33/32* (2013.01); *H01L 21/76254* (2013.01); *H01L 31/1852* (2013.01); *H01L 31/1856* (2013.01); *H01L 31/1892* (2013.01); *H01L 33/0075* (2013.01); *H01L 33/0079* (2013.01); *H01L 33/40* (2013.01); *H01L 2924/0002* (2013.01); *H01S 5/0425* (2013.01); *H01S 5/32341* (2013.01); *H01S 2301/173* (2013.01); *Y02E 10/544* (2013.01)

(58) Field of Classification Search
None
See application file for complete search history.

(56) References Cited

U.S. PATENT DOCUMENTS

2004/0166599 A1* 8/2004 Ishida .............................. 438/22
2004/0175852 A1* 9/2004 Ooi et al. ........................ 438/22
(Continued)

FOREIGN PATENT DOCUMENTS

| FR | 2681472 A1 | 3/1993 |
| FR | 2857982 A1 | 1/2005 |
| WO | 0170005 A2 | 9/2001 |

OTHER PUBLICATIONS

Aspar et al., Silicon Wafer Bonding Technology for VLSI and MEMS applications, published by S.S. Iyer and A.J. Auberton Hervé, INSPEC, London, Chapter 3 (2002), pp. 35 52.

(Continued)

*Primary Examiner* — Alexander Ghyka
*Assistant Examiner* — Abdulfattah Mustapha
(74) *Attorney, Agent, or Firm* — TraskBritt (57) ABSTRACT

The invention relates to a method for fabricating a structure including a semiconductor material comprising: a) implanting one or more ion species to form a weakened region delimiting at least one seed layer in a substrate of semiconductor material, b) forming, before or after step a), at least one metallic layer on the substrate in semiconductor material, c) assembling the at least one metallic layer with a transfer substrate, then fracturing the implanted substrate at the weakened region, and d) forming at least one layer in semiconductor material on the at least one seed layer, for example, by epitaxy.

24 Claims, 6 Drawing Sheets

(51) Int. Cl.
*H01L 31/18* (2006.01)
*H01L 33/40* (2010.01)
*H01S 5/042* (2006.01)
*H01S 5/323* (2006.01)

(56) References Cited

U.S. PATENT DOCUMENTS

| | | |
|---|---|---|
| 2006/0211159 A1 | 9/2006 | Bruederl et al. |
| 2007/0158639 A1* | 7/2007 | Yang et al. ............ 257/14 |
| 2008/0265265 A1* | 10/2008 | Xiong et al. ............ 257/97 |
| 2009/0032830 A1 | 2/2009 | Li |
| 2009/0039382 A1* | 2/2009 | Su ........................ 257/99 |
| 2010/0055818 A1* | 3/2010 | Chen et al. ............ 438/33 |
| 2010/0081254 A1 | 4/2010 | Shimomura et al. |
| 2010/0129948 A1 | 5/2010 | Isaka |
| 2011/0186863 A1* | 8/2011 | Lee et al. ............... 257/79 |
| 2012/0043567 A1* | 2/2012 | Yan et al. ............... 257/98 |
| 2013/0193466 A1* | 8/2013 | Sudhiranjan et al. ... 257/98 |

OTHER PUBLICATIONS

French Search Report for French Application No. 1059476 dated Feb. 18, 2011, 1 page.

Guo et al, Current Crowding and Optical Saturation Effects in GaInN/GaN Light-Emitting Diodes Grown on Insulating Substrates, Applied Physics Letters, vol. 78, No. 21, May 21, 2001, pp. 3337-3339.

International Search Report for International Application No. PCT/EP2011/070249 dated Dec. 22, 2011, 3 pages.

Schone et al., III-V Solar Cell Growth on Wafer-Bonded GaAs/Si-Substrates, IEEE 4th World Conference on Photovoltaic Energy Conversion, No. 4059744,, (2006) pp. 776 779.

Tong, Q.-Y, Silicon Wafer Bonding Technology for VLSI and MEMS applications, published by S.S. Iyer and A.J. Auberton Hervé, INSPEC, London, Chapter 1, (2002) pp. 1-20.

International Written Opinion for International Application No. PCT/EP2011/070249 dated Dec. 22, 2011, 5 pages.

International Preliminary Report on Patentability for International Application No. PCT/EP2011/070249 dated May 21, 2013, 6 pages.

* cited by examiner

METHOD FOR FORMING A BURIED METAL LAYER STRUCTURE

TECHNICAL FIELD

The invention relates generally to the fabrication of a semiconductor device, e.g., of planar type such as an LED, possibly GaN-based and on a sapphire substrate.

BACKGROUND

When fabricating this type of device, contacts are formed that have a resistance that is as low as possible in order to obtain uniform distribution of electric current in the active part of the device.

In particular, such devices are fabricated on a thick, highly doped GaN layer in order to obtain the lowest possible sheet resistance, preferably less than 5Ω (ohm). Sheet resistance is defined as the ratio between electric resistivity and film thickness. The impact of sheet resistance on the uniformity of current in a planar LED structure is described in the article by X. Guo et al. published in *Appl. Phys. Lett.* 78, 21:3337 (2001).

Figure 1:
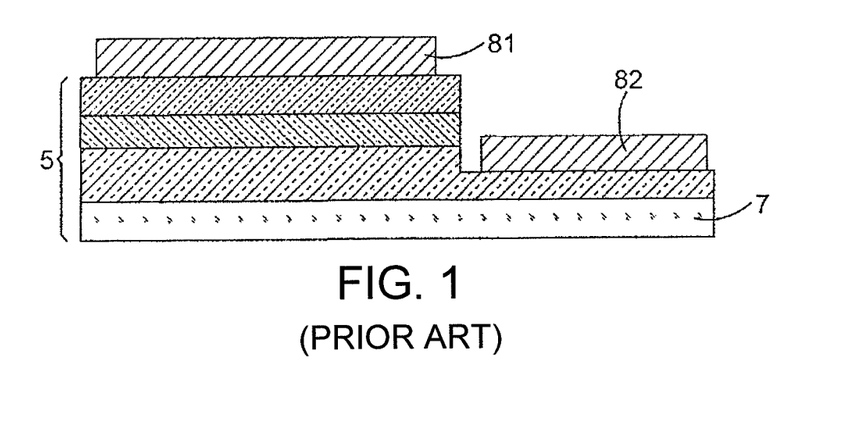
FIG. 1 illustrates a planar semiconductor structure.

A structure of a known compound is schematically illustrated in FIG. 1. It comprises an assembly of layers forming the device, e.g., stack 5, resting on a substrate 7. Contacts 81, 82 are respectively applied on the upper layer of the stack 5 and on the lower layer thereof, respectively.

U.S. Patent Application Publication No. 2006/0211159 describes a technique for fabricating an LED with electrical contacts on a metallic contact layer, which allows the required thickness of doped semiconductor material to be reduced, while providing contact with low resistance.

This technique is schematically illustrated in FIGS. 2A-2E.

A composite substrate comprising a GaN growth layer 12 bonded on a mechanical carrier 2 in sapphire (FIGS. 2A and 2B) is formed by assembly of the carrier 2 with a substrate 1 in GaN. The latter is previously implanted to form a weakened region 17 therein, separating it into two parts: the layer to be transferred 12 and the negative layer 11 of the substrate 1.

Figure 2A:
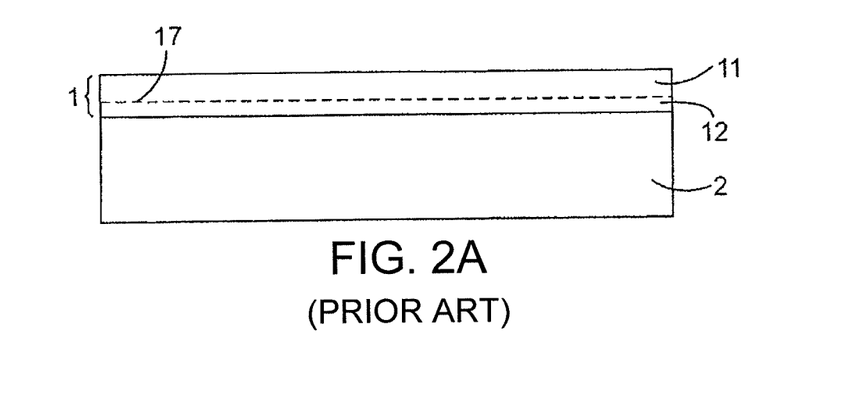
FIGS. 2A to 2E illustrate steps for preparing a planar semiconductor structure, according to a known method.
Figure 2B:
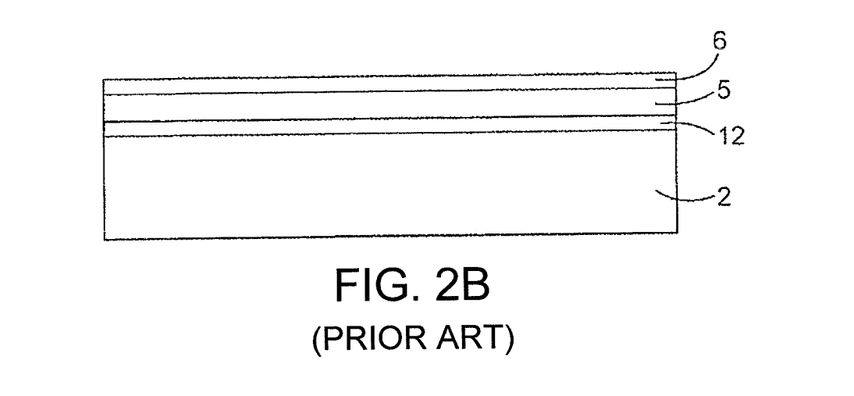

An epitaxy of layers 5 used to form the device, is then conducted on the growth layer 12 (FIG. 2B).

Figure 2C:
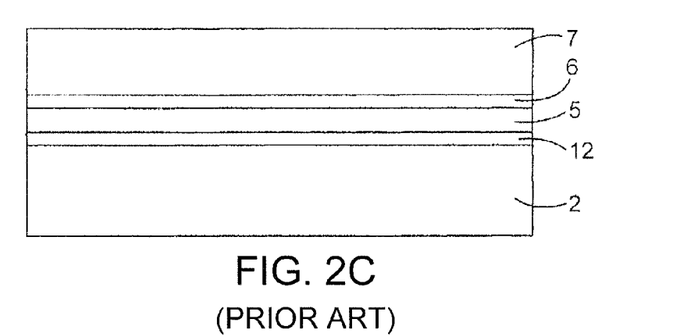
Figure 2D:
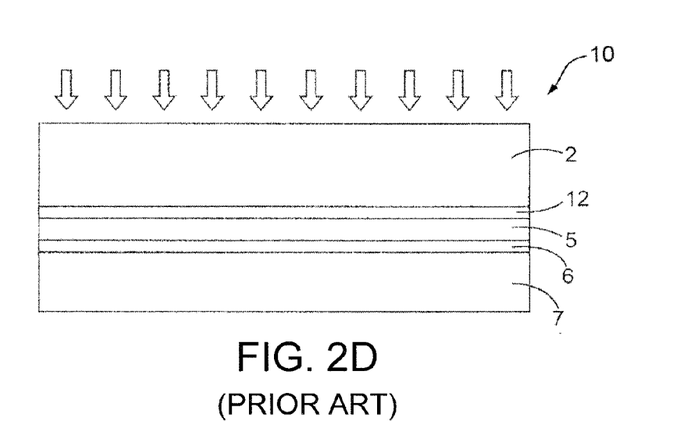

A metallic layer 6 is deposited on this stack, after which a substrate 7 adapted to the functioning of the LED is bonded onto the layer 6 (FIG. 2C) before detaching the growth carrier 2. This latter operation is performed by means of laser radiation 10 directed through the transparent carrier 2, toward the interface between the carrier 2 and the GaN layer 12 (FIG. 2D). In this manner, decomposition of an interface layer is achieved, not illustrated here, via thermal effect resulting from the action of the laser beam allowing the carrier 2 to be detached from the remainder of the structure.

Figure 2E:
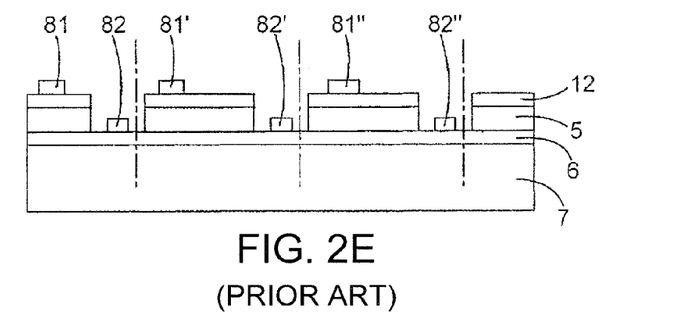

It is then possible to etch the stack remaining on the substrate 7 down to the layer 6 and to form contact regions 81, 81', 81'', 82, 82', 82'', first, on this metallic layer 6 and second, on the portions of the layer 12 in GaN (FIG. 2E). This gives rise to an assembly of independent, individual devices that can be separated along the detachment lines shown in FIG. 2E as vertical dashed lines.

It is thus possible to form contacts on the portions of metallic layer 6 that are located between the stacks 5.

This technique requires the transferring of epitaxy structure 5 onto a final substrate 7 that, in addition to a bonding step, involves a step to turn over the structure (which may cause damage thereto), followed by a step to detach the growth carrier 2 by laser radiation 10.

The problem, therefore, arises in finding another method for forming a structure that, in addition to an assembly of layers forming an active planar component, comprises a substrate carrying this component and contact regions for the functioning of this structure.

BRIEF SUMMARY

The invention first proposes a method for fabricating a structure including a semiconductor material comprising:
  a) implanting one or more ion species to form a weakened region delimiting at least one layer in a substrate of semiconductor material,
  b) forming, before or after step a), at least one metallic layer on the substrate in semiconductor material;
  c) assembling the metallic layer with a transfer substrate, then fracturing the implanted substrate at the weakened region to form an assembly comprising at least the layer in semiconductor material, called the seed layer, the metallic layer and the transfer substrate; and
  d) forming at least one layer in semiconductor material on the seed layer, for example, using epitaxy.

The metallic layer can be formed on the substrate before step a) so that implanting is performed through at least the metallic layer.

The layer in semiconductor material to form the seed layer may be of III/V type, e.g., in GaN, or in InP or in GaAs, or of type IV, e.g., in Ge or in SiGe, or of type II/VI, e.g., in ZnO or in ZnSe.

Therefore, the invention proposes a method that first allows the forming of a substrate or layer in semiconductor material, for example, of type III/V, which may be binary, ternary or quaternary, on a metallic layer, which may then be used as an electrode or electrical contact for the formed stack.

Some steps that need to be implemented in prior art methods, such as the transfer of the stack onto a final substrate and the removal of the growth carrier for forming the contacts, are thereby avoided.

The metallic layer preferably has electric resistivity of less than $10^{-3}$ Ω×cm.

Advantageously, the metallic layer also has good conductivity from a thermal viewpoint, for example, having thermal conductivity equal to or higher than 10 W/mK.

Its thickness may be between 10 nm and 500 nm, for example.

Further advantageously, for opto-electronic applications of LED type, this metallic layer has a refractive index at the emission wavelength of the LED under consideration that is adapted to obtain high reflectivity, typically higher than 30%, so that radiation emitted by the stack forming the active layer is able to be correctly reflected.

The metallic layer can be chosen from among refractory metals to avoid metallic contamination during high-temperature epitaxy of a layer.

For epitaxy of a layer at lower temperature, for example, lower than 600° C., one or more non-refractory metals can be used, chosen, for example, from among Pd, Au, Al, Cu and Ag, or indium-tin oxide.

The metallic layer is preferably chosen from among tungsten, molybdenum, niobium, tantalum and the binary, ternary or quaternary alloys of either one of these elements, such as TaW, MoW, MoTa, MoNb, WNb or TaNb, or from among titanium nitride, the silicides, preferably tungsten silicide or molybdenum silicide, metallic borides, for example, zirconium boride, tungsten boride, or titanium boride.

Step d) may comprise the formation of a plurality of layers including at least one semiconductor material. In particular, this plurality of layers may comprise at least one active buried layer.

A method according to the invention may further comprise the applying of one or more first electrical contacts on the layer or plurality of layers in semiconductor material formed on the seed layer, and of at least one second electric contact on the metallic layer or on the seed layer or optionally on a layer underlying the active buried layer.

In particular, with the forming of an active buried layer, the sheet resistance between the second contact and the active buried layer is preferably less than 20Ω (ohm), or even less than 5Ω (ohm).

The implanting, at energy lower than 500 keV and preferably at energy lower than 200 keV, can be performed through the metallic layer.

A method according to the invention may further comprise a step for forming a bonding layer, e.g., in $SiO_2$ or silicon nitride, on the metallic layer and/or on the transfer substrate to facilitate assembly.

The device obtained may be an LED or a resonating cavity LED (RCLED), or a laser, for example, with vertical cavity surface-emitting lasers (VCSELs), or a photovoltaic cell.

The invention also concerns a semiconductor device comprising:
  at least one metallic layer on a carrier,
  a first layer in semiconductor material, assembled with the metallic layer, and a plurality of layers in semiconductor material comprising at least one layer called an active layer separated from the first layer in semiconductor material by a second layer,
  at least one first electrical contact formed on the top of the plurality of layers in semiconductor material, and at least one second electrical contact on the first layer in semiconductor material or on the metallic layer or on the second layer.

The second layer may be a material whose lattice parameter is identical or close to that of the first layer in semiconductor material.

If the device forms a photovoltaic cell, the carrier may be a material chosen from among silicon, sapphire or AlN, the metallic layer then being a material chosen from among palladium, tungsten or molybdenum, the first layer being a material chosen from among GaAs, Ge or InP and the plurality of layers comprising a stack of layers in semiconductor materials of type III-V.

If the device forms an LED, the second layer may comprise at least one layer of n-doped GaN having a thickness of between about 100 nm and 500 nm.

In the device according to the invention, the stack may be a material whose lattice parameter is identical or close to that of the seed layer in semiconductor material.

DETAILED DESCRIPTION

A method according to the invention uses a substrate including a semiconductor material, for example, of type III/V such as GaN, InP or GaAs, or of type IV such as Ge or SiGe, or of type II/VI such as ZnO or ZnSe. As explained below, this substrate will allow the forming of layer 20a called the "seed" layer.

In the present application, mention is made on several occasions of a thin film transfer method using an implanting and fracturing technique.

The method is described, for example, in document FR 2681472 or in the article by B. Aspar and A. J. Auberton-Hervé, "Silicon Wafer Bonding Technology for VLSI and MEMS applications," published by S. S. Iyer and A. J. Auberton-Hervé, 2002, INSPEC, London, Chapter 3, pages 35-52.

In the remainder hereof, reference is also made to molecular bonding, also called "direct bonding." This assembly technique is described in particular by Q. Y. Tong in "Silicon Wafer Bonding Technology for VLSI and MEMS applications," published by S. S. Iyer and A. J. Auberton-Hervé, 2002, INSPEC, London, Chapter 1, pages 1-20.

Figure 3A:
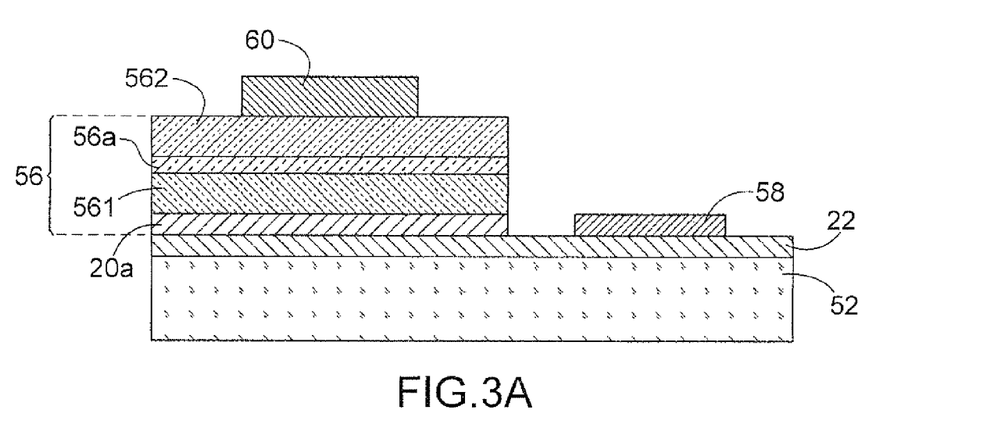
FIGS. 3A-3C illustrate structures of a device according to the invention or obtained using a method of the invention.
Figure 3B:
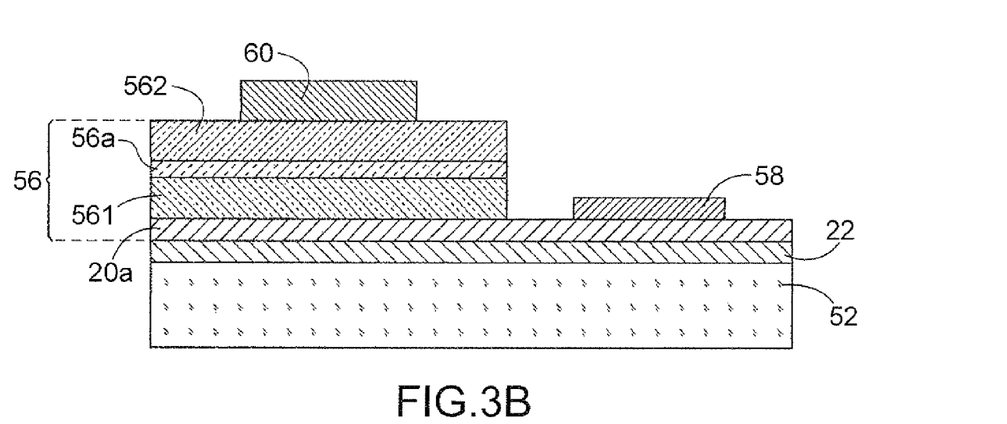
Figure 3C:
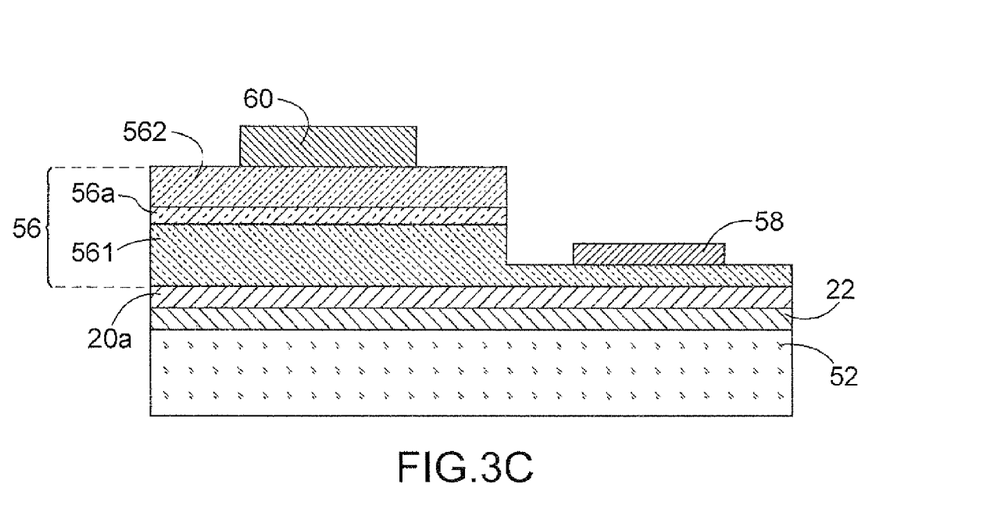

Examples of structures of devices according to the invention, or obtained using the method according to the invention, are illustrated in FIGS. 3A-3C.

Each of these structures comprises a thin layer 22 of metallic material assembled on a substrate 52, optionally via one or more bonding layers (not illustrated in FIGS. 3A-3C). On this metallic layer, a so-called "seed" layer 20a was formed.

On this latter layer, there rests an assembly of layers forming a semiconductor stack 56, for example, of planar type.

The stack 56 comprises a first layer 561, one or more layers 56a, for example, in gallium nitride and/or InGaN for an LED, and at least one second layer 562, all the layers 56a being sandwiched between the layers 561 and 562 and these two latter layers possibly being in semiconductor material. All the layers 56a form what is called the active part of the device. It is buried (underneath layer 562) and separated from the seed layer 20a by at least one other layer 561.

In the structure shown in FIG. 3A, a first electrical contact 58 is formed directly on the metallic layer 22, and another contact 60 is positioned above the semiconductor stack 56.

In the structure shown in FIG. 3B, a first electrical contact 58 is formed with the seed layer 20a. Another contact 60 is positioned above the semiconductor stack 56. With this embodiment, it is possible to avoid etching the layer 20a or exposing layer 22 to an etching agent with which it would react, as explained below in more detail.

In the structure in FIG. 3C, a first electrical contact 58 is formed with the layer 561. Another contact 60 is positioned above the semiconductor stack 56. In this embodiment, layer 561 is not fully etched. With this embodiment, it is possible to avoid exposing layer 20a to an etching agent.

In other words, a device according to the invention comprises in this order:
  a substrate 52,
  optionally one or more bonding layers,
  a metallic layer 22,
  a seed layer 20a,
  a plurality 56 of semiconductor layers, comprising, in particular, at least one layer 56a in semiconductor material called the active part or layer, buried in the stack 56 and lying between two layers 561, 562 of which one (layer 561) separates the seed layer 20a from the active layer 56a of the device;
  a first electrical contact 58 taken either directly on the layer 22, or on the seed layer 20a in semiconductor material, or on layer 561, and a second contact 60 made on the stack forming the semiconductor device 56.

The material of the so-called seed layer 20a may have a lattice parameter identical or close to that of layer 561, on which the active part 56a of the device can subsequently be formed. The active part or layer 56a is buried: it lies underneath at least one layer such as layer 562, but also on at least one layer such as layer 561.

For an LED or a laser, this active, buried part 56a essentially comprises the region of material that emits light (for example, an assembly of quantum wells), in which case, it is in gallium nitride, for example, or InGaN.

For a photovoltaic cell, this active, buried part 56a corresponds to the space charge zone at the pn junction of the cell; it is then AsGa, for example, or InP or Germanium.

The layers of the plurality 56 of semiconductor layers may be in different materials or in one same material with different doping. Each of these layers is preferably a binary, ternary or quaternary alloy of type III-V semiconductor materials.

The assembly or stack of layers 56 may optionally be reduced to a single layer. The examples of structures given above can be easily transposed to cases in which a single layer 56 is formed on the seed layer 20a and on which a contact 60 is applied. The contact 58 is then taken, either on layer 22 or on layer 20a.

One implementation of a method according to the invention will now be described in conjunction with FIGS. 4A-4H.

A substrate 20 in semiconductor material of one of the types set forth above, e.g., of type III/V, is selected.

Figure 4A:
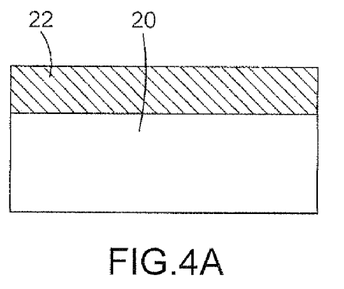
FIGS. 4A to 4H illustrate steps for preparing a planar semiconductor structure according to a method of the invention.
Figure 4B:
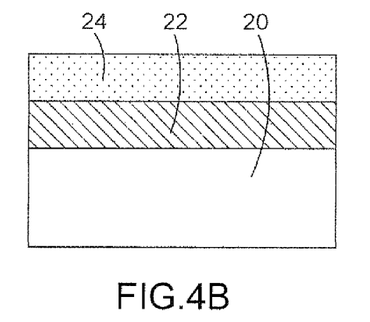
Figure 4C:
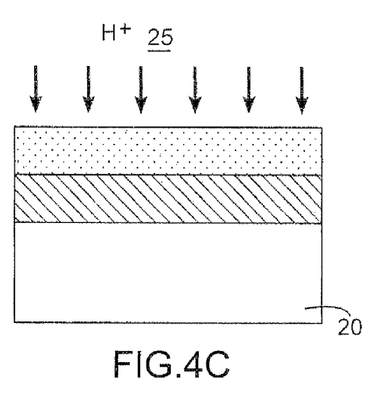

A metallic layer 22 is formed on one side of this substrate 20 (FIG. 4A). The constituent material of this layer is chosen, for example, from among tungsten, molybdenum, niobium, tantalum and the binary, ternary or quaternary alloys of either one of these elements such as TaW, MoW, MoTa, MoNb, WNb or TaNb, or from among titanium nitride, silicides, preferably tungsten silicide or molybdenum silicide, zinc oxide, metallic borides, for example, zirconium boride, tungsten boride, titanium boride or chromium boride, and indium-tin oxide.

The material of this metallic layer has low resistivity, typically less than $10^{-3}$ Ω×cm that, between the second contact 58 and the active part 56a of the device, allows a sheet resistance to be obtained of less than 20 and preferably less than 5Ω (ohm). It is recalled that a layer of tungsten 200 nm thick has a sheet resistance of 0.26Ω.

In general, the sheet resistance of the bi-layer, formed first by layer 20a in semiconductor material (which is formed from the substrate 20 in the manner described below) and second by the layer 22 in metallic material, is substantially equal to the sheet resistance of this latter layer. Therefore, an LED structure formed using a method according to the invention, comprising a layer 20a of doped GaN (having a resistivity of 0.01 Ω×cm) with a thickness of 100 nm, on a metallic layer 22 of tungsten 50 nm thick, offers a sheet resistance of 1Ω. This same value of sheet resistance without the underlying metallic layer, would be obtained with a GaN film having a thickness 1000 times greater, i.e., 100 μm, which would lead to a major cost for epitaxy of the material. In addition, a thickness of GaN film epitaxied on sapphire generates extensive bending of the wafer, making it difficult to use for the fabrication of devices. Also, cracks generated by the differences in expansion of the materials may render the wafer useless.

The material of the metallic layer may, in particular, be chosen in relation to some desired properties having regard to intended applications, optical applications, in particular.

For example, to form an LED, preference is given to a material whose refractive index at the emission wavelength under consideration, for example, between 400 nm and 700 nm, particularly for a white LED, is adapted to obtain extensive reflectivity, for example, greater than 30% so that the radiation emitted by the stack 56 forming the active layer 56a is able to be properly reflected, which allows an increase in the quantum extraction efficiency of the device.

It is also possible, optionally in combination with the preceding properties, to select a material that has particular thermal properties, for example, a refractory material for the purpose of subsequent growth of materials by epitaxy and/or a material having good thermal conductivity for good evacuation of the heat released during the functioning of the device after it has been fabricated. Typically, for applications that release much heat, in particular, for LEDs, lasers, transistors or RF applications, provision is made for sufficient heat evacuation to obtain satisfactory cooling of the device and to ensure a long lifetime. In this case, the metal is preferably chosen for its thermal conduction that is higher than 100 W/mK. For example, the choice may be made from among Mo, W, Cu, Al, Au, Ar.

The metallic layer 22, in this example, is then coated with a layer 24 called a "bonding layer" (FIG. 4B), which may be an electrically and/or thermally insulative material. For example, it is a layer of silicon dioxide ($SiO_2$) or silicon nitride, having a thickness of a few tens or hundreds nm, for example, between 10 nm and 500 nm; as a further example, about 200 nm.

Next, it is implanted with one or more ion species (FIG. 4C), preferably at least hydrogen, to a mean depth p close to the desired thickness for a future thin layer of semiconductor material on which epitaxial growth, for example, may subsequently be carried out. An implanting beam 25 successively passes through the optional bonding layer 24 and the metallic layer 22. This may carry an advantage since, depending on the heat schedule required for depositing the metallic layer 22, this may risk causing or initiating a fracture in the substrate 20 when the layer 22 is deposited after implantation using a standard dose. This would be the case, for example, when a metallic layer of W is deposited typically at 450° C. by CVD, or a metallic layer of TiN at 350° C. by PVD on implanted GaN.

As a variant, it is possible, according to the invention, to carry out implanting in the substrate 20 right at the start, even before forming layer 24 and/or the metallic layer 22 therein. For example, it is possible to reduce the implanted dose (but this may make fracturing of the material more difficult) and, optionally, to use a low-temperature depositing method.

A weakened region 27 is thereby formed in the substrate 20. The depth of implanting may be of any depth in relation to the energy of the implanting beam.

For example, implanting is carried out with hydrogen or hydrogen and helium, with doses of between $10^{16}$ at/cm$^2$ and $10^{18}$ at/cm$^2$, and using an energy of between 50 keV and 400 keV, depending on the thickness of the layer 20a to be fanned.

If the possible energy of the beam is limited, care is taken to select the thickness of the layers to be crossed and, in particular, of the metallic layer 22 in relation to this energy. Therefore, for a metallic layer 22 in tungsten, a thickness of this layer of less than 200 nm will allow an energy range to be maintained that is easily reached with industrial implanters, for example, lower than 200 keV, while maintaining the desired sheet resistance (for a tungsten layer of thickness 200 nm, the sheet resistance is 0.26Ω). For materials less dense than tungsten (which has a density of 19.25 g/cm$^3$), for example, molybdenum (density=10.28 g/cm$^3$), or TiN (density=5.4 g/cm$^3$), it is possible to form a layer having a thickness of more than 200 nm while maintaining industrial implanting energy.

As will have been understood from the foregoing explanations, it is the implanting energy that, for given materials through which implanting passes, will determine the thickness of the future layer 20a to be obtained after fracturing along the implanted region.

In other words, the use of this implanting technique allows precise control over the thickness of the future layer of semiconductor material.

In addition, a second substrate (called a handle substrate 30) is prepared, for example, in sapphire or polycrystalline SiC or in silicon. Optionally, a bonding layer 32, preferably a dielectric layer, e.g., in $SiO_2$, can be formed on the surface of this substrate 30 with a view to assembly with layer 24, if this layer is present, or with layer 22. This bonding layer 32 may have a thickness of between 10 nm and 500 nm, preferably close to 200 nm.

The surfaces intended to come into contact may then undergo specific treatment with a view to bonding; for example, they may be subjected to chemical mechanical polishing (CMP). This treatment particularly allows the desired roughness to be obtained for bonding, preferably less than 1 nm (measured by AFM on a field 5 μm×5 μm), as well as adequate surface activation.

Figure 4D:
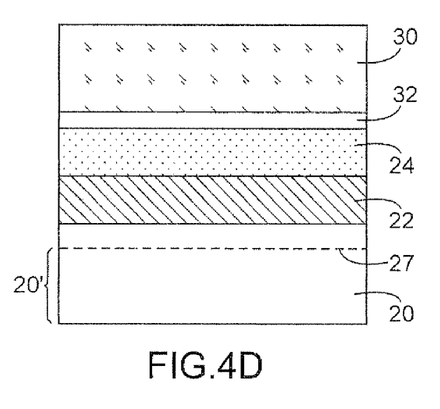
Figure 4E:
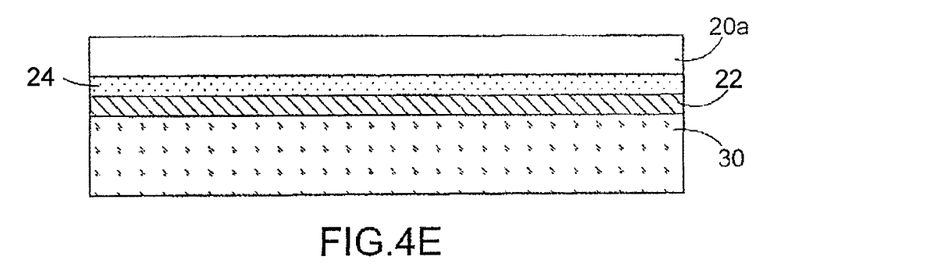

The two substrates are then bonded by direct bonding (FIG. 4D). The bonding layers 24, 32 and/or the sides previously subjected to specific treatment for bonding are then brought into contact with each other.

With heat treatment optionally assisted by the application of a mechanical force, the transfer of a layer 20a of semiconductor material is initiated by fracturing along the weakened region 27 (FIG. 4D). For example, heat treatment is conducted at between 100° C. and 500° C., preferably in the region of 300° C., to initiate the transfer of that layer. This heat treatment allows ripening of the microcavities formed during the implantation step in region 27, which leads to the desired fracturing in the substrate 20.

A surface finishing process on the surface of the layer or film 20a, such as heat treatment and/or, optionally, dry etching and/or polishing to repair any damage to the material further to ion implantation and/or to obtain roughness compatible with the subsequent forming of components on the surface of this layer 20a, in particular by epitaxy, can then be carried out. This finishing process will not significantly affect the thickness of layer 20a. Therefore, according to the invention, it is the implantation depth of the implanted species that precisely determines the thickness of the layer 20a of semiconductor material, the layer derived from fracturing along the implanted region being subjected to a mere finishing polish.

With a method according to the invention, it is, therefore, possible to obtain a layer 20a of semiconductor material, having a thickness that is precisely controlled, on a buried metallic layer 22, itself lying on a host substrate 30. A bonding region, defined by the layers 24, 32, optionally connects the substrate 30 and the metallic layer 22.

Also, the negative 20' of the substrate 20, which was removed after fracture, can be re-used to form another layer of semiconductor material.

Figure 4F:
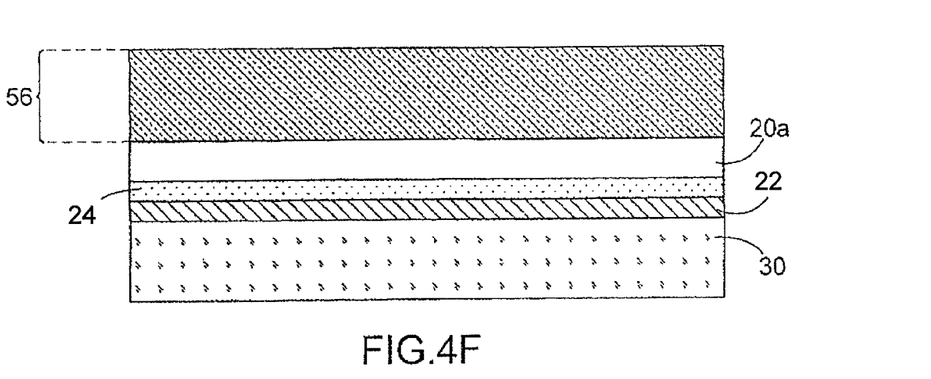

Finally, any operation can be carried out to form a layer or a stack of layers 56, such as in FIG. 4F; for example, this stack may be identical or similar to the stack of layers 56 in any of FIGS. 3A to 3C. In FIG. 4F, this stack 56 is not shown in detail. For example, it is formed by epitaxy of successive layers on the seed layer 20a.

In particular, with regard to a GaN-based light-emitting diode, resumed epitaxy on the seed layer 20a allows a doped GaN film 561 to be formed (see the structure in FIG. 3A, for example), doped, for example, with silicon, to obtain n-type doping. This film, having a thickness of about 100 nm, or between 100 nm and 500 nm, differs from the prior art in which it is necessary to deposit at least 1 μm, and generally 3 μm, of doped GaN to obtain the desired sheet resistance. After this layer, several quantum wells 56a are formed, $In_xGa_{1-x}N$ (X being around 20%), each having a thickness, for example, of about 3 nm, or a double heterostructure is formed $In_xGa_{1-x}N$ (X being about 10%), about 10 nm thick, for example. Finally, a film 562 of p-doped GaN is deposited, for example, using Mg, having a thickness of about 100 nm.

Figure 4G:
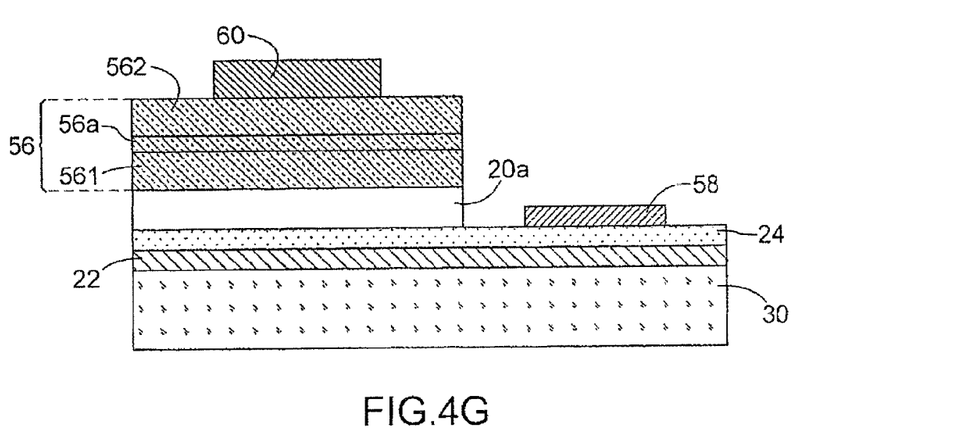
Figure 4H:
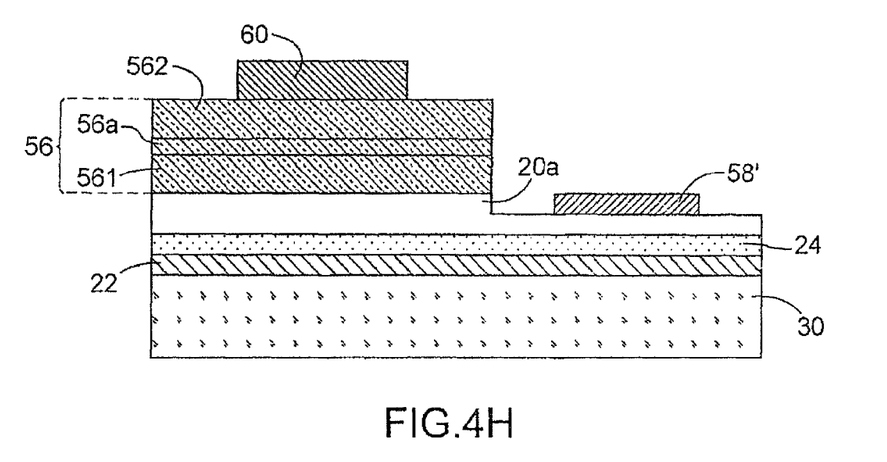

Contacts 58, 60 can finally be formed; first, on the formed stack 56 and, second, on the metallic layer 22 (the case in FIG. 3A that assumes side etching of the stack 56 and of the layer 20a, to expose the desired regions for the purpose of forming the contacts 58). An example of a structure obtained after this partial etching and formation of the contacts 58 directly on the metallic layer 22 is illustrated in FIG. 4G. The etching of the layer 20a with standard reagents is non-selective and may damage the metal of the underlying layer 22. It is, therefore, advantageous to use an etching reagent that is selective with respect to the metal used, i.e., that has a much higher etching rate of the layer 20a, for example, ten times higher than that of the metallic layer 22.

As a variant (FIG. 4H), it is also possible only to etch the formed stack partly over its height or the direction of the stack 56, as far as the layer 20a, but not beyond, and to form a contact 58 on this layer 20a, in which case, the structure shown in FIG. 3B is obtained. The etching process is then shorter, hence, less costly, and one or more standard non-selective reagents can be used. In this case, even though the contact 58' is taken on the semiconductor material 20a, the presence of the underlying metallic layer 22 allows a significant reduction in the access resistance of the device compared with a contact on a semiconductor material alone without an underlying metallic layer 22, and also allows improved uniformity of the electric current at the active region 56a of the device. The layer 20a of semiconductor material and the contiguous metallic layer 22 can be likened to two resistances in parallel, the current, therefore, circulating in the layer 22 of lesser resistance. Having regard to the dimensions of the device in which the thickness of the layer 20a of the order of one micrometer, e.g., between 1 μm and 5 μm, is distinctly smaller than the horizontal distance between the contacts, of the order of several tens of micrometers, e.g., between 20 μm and 50 μm or 100 μm, this variant of embodiment allows the obtaining of electric resistance that is only slightly higher than in the embodiment in FIG. 4G, while remaining much lower than that of devices known in the prior art.

A method according to the invention allows the fabrication of devices:
  in the field of optoelectronics, e.g., for the fabrication of LEDs or lasers;
  in the field of micro-electronics, e.g., for the fabrication of power devices of diode type, or bipolar transistors;
  in the field of radio frequency;
  and in the field of photovoltaics.

The invention can also be used in photovoltaic devices for CPV technology applications or in the spatial sector. In particular, the invention offers an advantageous alternative to the structure proposed in the article "III-V solar cell growth on wafer-bonded GaAs/Si substrates" by J. Schone et al., *IEEE*, 2006, p. 776-779. A side-conducting layer of a highly doped semiconductor material is specifically added to the stack of the structure in FIG. 7 of this document to form the rear contact of the solar cell. By means of the invention, the growth of this conduction layer could be avoided since it is replaced by the metallic layer 22 already present in the growth structure of the stack of active layers.

For this type of application, preferable choice is made of a carrier 30 in silicon, AlN, ceramic, or sapphire onto which the seed layer 20a will be transferred in GaAs, or in Ge or InP, or another binary, ternary or quaternary alloy of III-V materials, via the metallic layer 22. These semiconductor materials being costly, it is of interest to be able to recycle the negative 20' of the substrate 20 from which layer 20a is removed.

The metal of layer 22 can be chosen from among all the metals already cited and is preferably chosen from among the metals allowing contacts to be formed on III/V materials, for example, and their alloys, therefore, for example, gold, palladium, copper, tungsten, or molybdenum. Depending on the depositing techniques under consideration, this metallic layer can be deposited before implanting the ion species but also as a variant afterwards, insofar as the heat schedule for depositing does not risk generating fracture at the weakened region.

Once the growth structure has been formed, a layer or several layers of a stack 56, for example, in materials derived chiefly from III-V alloys whose stacking in layers is adapted according to their band gap, are deposited on the seed layer 20a. Then, a "front" electric contact 60 is formed on this stack, for example, by depositing metals such as Ti/Al or Au, and a "rear" electric contact 58 is deposited on the metallic layer 22. In this manner, a cell of multijunction type is obtained for photovoltaic applications.

The invention can also be used to obtain a light-emitting diode (LED). It then offers advantages in terms of electric injection, crystallographic quality of the semiconductor material, of heat evacuation during the operation of the device and more homogeneous light extraction.

A structure obtained using a method according to the invention offers lower access resistance than when the contacts comprise a layer of doped semiconductor material deposited on an insulating substrate, without any underlying metallic layer, for example, a film of GaN epitaxied on sapphire. As a result, the current, which, therefore, passes through the metallic layer 22 and then the formed device, is more homogeneous. And with respect to LEDs, the resulting emission is even more homogeneous. Typically, for a GaN-based LED epitaxied on sapphire, such as described in the article by X. Guo et al. published in *Appl. Phys. Lett.* 78:3337-3339, with a thickness of the n-doped GaN layer of 2 gm and a thickness of the p-doped GaN layer of 0.3 μm, the density of the current along the active layer varies exponentially $J(x)=J(0) \times \exp(-x/Ls)$, Ls being defined in the aforementioned article as the current spreading length. During the functioning of the LED, the intensity of light emission varies in the same manner as the current density as illustrated in the above-cited article. The length Ls can be calculated from the values of electric resistivity. Assuming typical values for the resistivity of the n-doped GaN layer of 0.01 Ω×cm, the resistivity of the p-doped GaN layer of 1 Ω×cm and a contact resistivity on the p-doped GaN layer of 0.1 Ω×cm², the value of 450 μm is obtained for Ls, substantially equal to the reported experimental value.

If these same values are applied to a structure according to the invention, with a p-doped GaN film 100 nm thick, and a metallic film in tungsten 200 nm thick, an access resistance is obtained on the n side of 1Ω instead of 50Ω in the preceding case.

The current spreading length will be more than 3 mm, much longer than the conventional size of the patterns of these devices (less than 1 mm). Giving consideration to patterning of 1 mm, the reduction in current between the side ends of the active region is 27% according to the structure of the invention, whereas it is almost 90% for the structure reported in the above-cited article.

Finally, for a structure formed by epitaxy on a layer 20a of semiconductor material, for example, of type III/V, the crystallographic quality obtained is better than the quality resulting from direct forming on a mechanical carrier in sapphire, for example. According to the method described in the present invention, the material of the seed layer 20a may be identical to the base material of layer 56 or it may have a very close lattice parameter, therefore, giving rise to lattice matching between the films 20a and 561. The layer 561 will, therefore, have substantially the same crystallographic quality as the seed layer 20a.

When implementing the invention, a GaN film 20a has a density through dislocations of less than $10^8$ cm$^{-2}$. A reduced dislocation density is desirable to obtain better performance and a longer lifetime of the device.

For some applications such as optical communications via fibers, it is of interest to have light emission whose spectrum width is narrow and whose intensity is highly directive. For this purpose, it is sought to draw advantage from the resonating optical cavities present in structures such as resonating cavity light-emitting diodes (RCLEDs) vertical cavity surface-emitting lasers (VCSELs). The fabrication of such devices is not easy; it comprises two mirrors either side of a semiconductor film and it is further desired to have a thin cavity of well-controlled thickness. The best cavity fineness is obtained with a thickness of $\lambda/(2n)$, $\lambda$ being the emission wavelength in air and n being the refractive index of the semiconductor. This thickness is typically about 100 m. The present invention has the advantage of including a metallic film 22 that can act as mirror on one side of the cavity, and making possible the fabrication of a semiconductor light-emitting diode whose thickness can easily be reduced to 100 nm, hence, fully compatible with the forming of a resonating cavity without affecting access resistance. The thickness of the active layer 56a is effectively determined by the thickness of the epitaxied layer or of the epitaxied stack 56, which can easily be controlled, and by the thickness of the seed layer 20a, which is determined by the implanting conditions and which can also be controlled.

This is not the case when fabricating an active layer using a standard method, since it is then necessary to cause a very thick buffer layer to grow on a growth carrier having a lattice parameter different from the active layer, in order to achieve satisfactory crystallographic quality. After transfer of the active layer and of the buffer layer onto the final LED substrate, it is necessary in the standard method to polish the buffer layer over a large thickness to obtain the resonating cavity, the polishing limit being difficult to determine.

The invention claimed is:

1. A method of fabricating a semiconductor structure, comprising:
    forming a first structure including a transfer substrate, a conductive layer comprising at least one metal element, and a seed layer comprising a semiconductor material, the conductive layer being disposed between the transfer substrate and the seed layer;
    after forming the first structure, depositing a layer stack including a plurality of semiconductor layers on the seed layer, at least one layer of the plurality of semiconductor layers including at least one active layer and at least one additional layer separating the seed layer from the at least one active layer; and
    providing one or more first electrical contacts on the layer stack, and at least one second electrical contact on at least one of the conductive layer, the seed layer and the at least one additional layer separating the seed layer from the at least one active layer.

2. The method of claim 1, wherein forming the first structure comprises:
implanting one or more ion species into a semiconductor substrate to form a weakened region delimiting at least one layer therein intended to form the seed layer;
forming the conductive layer on the semiconductor substrate; and
assembling the conductive layer with the transfer substrate and fracturing the semiconductor substrate at the weakened region to form the first structure including the transfer substrate, the conductive layer, and the seed layer.

3. The method of claim 2, wherein implanting the one or more ion species comprises implanting the one or more ion species with an energy of less than 200 keV.

4. The method of claim 2, wherein assembling the conductive layer with the transfer substrate comprises using a direct bonding process to bond the conductive layer to the transfer substrate.

5. The method of claim 1, wherein the semiconductor material of the seed layer comprises a III/V type semiconductor material or a II/VI type semiconductor material.

6. The method of claim 5, wherein the semiconductor material of the seed layer comprises at least one of GaN, InP, GaAs, ZnO, and ZnSe.

7. The method of claim 1, wherein the semiconductor material of the seed layer comprises a Group IV semiconductor material.

8. The method of claim 7, wherein the semiconductor material of the seed layer comprises Ge or SiGe.

9. The method of claim 1, wherein the conductive layer comprises at least one of tungsten, molybdenum, niobium, tantalum, and binary, ternary and quaternary alloys thereof.

10. The method of claim 1, wherein the conductive layer comprises at least one of a nitride, a silicide, a boride, and indium-tin oxide.

11. The method of claim 1, wherein the conductive layer comprises at least one of palladium, gold, aluminum, copper, and silver.

12. The method of claim 1, wherein the conductive layer has a thickness of between 10 nm and 500 nm.

13. The method of claim 1, wherein the conductive layer comprises material exhibiting a thermal conductivity higher than 10 W/mK.

14. The method of claim 1, wherein the at least one active layer comprises a buried active layer.

15. The method of claim 14, wherein a sheet resistance between the at least one second electrical contact and the buried active layer is lower than 20 ohm.

16. The method of claim 15, wherein the sheet resistance between the at least one second electrical contact and the buried active layer is lower than 5 ohm.

17. The method of claim 1, further comprising forming at least one of an LED, a laser, and a photovoltaic cell comprising the layer stack, the one or more first electrical contacts, and the at least one electrical contact.

18. An LED semiconductor device, comprising:
a carrier substrate;
at least one conductive layer comprising at least one metal element on the carrier substrate;
a seed layer of semiconductor material assembled with the at least one conductive layer, the seed layer disposed on a side of the at least one conductive layer opposite the carrier substrate;
a plurality of semiconductor layers formed on the seed layer, the plurality of semiconductor layers including an active region comprising a double heterostructure or a plurality of quantum wells, the active region separated from the seed layer by at least one additional layer of the plurality of semiconductor layers, the seed layer disposed between the at least one conductive layer and the plurality of semiconductor layers formed on the seed layer;
at least one first electrical contact on the plurality of semiconductor layers; and
at least one second electrical contact on the additional layer of the plurality of semiconductor layers, the seed layer, or the at least one conductive layer.

19. The device of claim 18, wherein the device exhibits a sheet resistance between the at least one second electrical contact and the active region of less than 20 ohm.

20. The device of claim 19, wherein the device exhibits a sheet resistance between the at least one second electrical contact and the active region of less than 5 ohm.

21. The device of claim 20, wherein the at least one conductive layer has a thickness of between 10 nm and 500 nm.

22. The device of claim 21, wherein the at least one conductive layer has a thermal conductivity higher than 10 W/mK.

23. The device of claim 21, wherein the additional layer of the plurality of semiconductor layers comprises a material having a lattice parameter at least substantially identical to a lattice parameter of the seed layer.

24. The device of claim 23, wherein the additional layer of the plurality of semiconductor layers comprises a layer of n-type doped GaN having a thickness of between about 100 nm and about 500 nm.

* * * * *

UNITED STATES PATENT AND TRADEMARK OFFICE
CERTIFICATE OF CORRECTION

PATENT NO. : 9,224,921 B2
APPLICATION NO. : 13/988196
DATED : December 29, 2015
INVENTOR(S) : Jean-Marc Bethoux and Pascal Guenard Page 1 of 1

It is certified that error appears in the above-identified patent and that said Letters Patent is hereby corrected as shown below:

In the specification:
COLUMN 6, LINE 53, change "to be fanned." to --to be formed.--
COLUMN 9, LINE 45, change "layer of 2 gm" to --layer of 2 µm--

Signed and Sealed this
Twenty-eighth Day of June, 2016

Michelle K. Lee
*Director of the United States Patent and Trademark Office*